United States Patent [19]
Nakazato et al.

[11] Patent Number: 6,147,398
[45] Date of Patent: *Nov. 14, 2000

[54] SEMICONDUCTOR DEVICE PACKAGE

[75] Inventors: Noriyuki Nakazato; Kyoji Yamasaki, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/895,557

[22] Filed: Jul. 16, 1997

[30] Foreign Application Priority Data

Mar. 21, 1997 [JP] Japan ..................................... 9-068286

[51] Int. Cl.7 ........................... H01L 23/48; H01L 23/52; H01L 23/053; H01L 23/12
[52] U.S. Cl. .......................... 257/696; 257/690; 257/692; 257/693; 257/700
[58] Field of Search ................................... 257/690, 692, 257/693, 696, 700, 735, 673

[56] References Cited

U.S. PATENT DOCUMENTS

| 5,081,520 | 1/1992 | Yoshii et al. | 257/702 |
| 5,224,021 | 6/1993 | Takada et al. | 361/406 |
| 5,397,916 | 3/1995 | Normington | 257/686 |
| 5,413,970 | 5/1995 | Russell | 437/208 |
| 5,663,596 | 9/1997 | Little | 257/727 |
| 5,801,439 | 9/1998 | Fujisawa et al. | 257/686 |

FOREIGN PATENT DOCUMENTS

| 1171234 | 7/1989 | Japan. |
| 6-97351 | 7/1994 | Japan. |

Primary Examiner—Mahshid Saadat
Assistant Examiner—Allan R. Wilson

[57] ABSTRACT

A packaging structure is capable of electrically connecting an external lead to a pad of a semiconductor chip by directly bonding the external lead to the pad of the semiconductor chip without an adhesive, which requires no resin sealing. The packaging structure comprises a lead member 20 having a fitting part with a U-shaped cross section, which can be fit into the semiconductor chip 10 from the end part thereof, and the fitting part pinches the semiconductor chip by means of an elastic restoration force or a plastic deformation, thereby allowing a contact point 20a at one end of the lead member 20 to directly bring into contact with the pad part 11 of the semiconductor chip and, at the same time, the fitting part is provided with a construction for insulating the lead member from the semiconductor chip in the internal circumference except for the contact point. The plurality of lead members 20 are arranged and fixed in a predetermined interval in a longitudinal direction to be integrated each other through the aforementioned insulating layer 30 to constitute an integrated member 100 which can be fit into the aforementioned semiconductor chip from the peripheral edge thereof.

15 Claims, 5 Drawing Sheets 6,147,398

SEMICONDUCTOR DEVICE PACKAGE

BACKGROUND OF THE INVENTION

1. Field of the Invention

The present invention relates to a packaging structure of a semiconductor device wherein a lead member for electrically connecting a semiconductor chip to a mounting substrate is directly attached on the semiconductor chip.

2. Prior Art

As a conventional packaging technique, as shown in FIG. 9, a semiconductor chip 1 is generally fixed to a chip mounting part 2 of a lead frame and a plurality of pads on the chip 1 are electrically connected to external lead members 4 of the lead frame using a bonding wire 3, and the resultant assembly is sealed with a resin 5. However, since a sufficient clearance C is required around the chip 1, the conventional technique is not suitable for the miniaturing of the packaging structure. Therefore, Japanese Patent Kokai (laid-open) No. 1-171234 proposes a structure where the external leads are directly bonded to a side portion of a semiconductor chip using an adhesive which has an insulating material characteristic to eliminate the clearance C between the external leads 4 and the semiconductor chip 1, and thereby miniaturize a packaging structure of the semiconductor device. On the other hand, Japanese Patent Kokai (laid-open) No. 6-97351 proposes a combination structure of external lead members and inner lead members instead of a bonding wire bonding to remove a limitation of a reduction in sealing resin thickness caused by of arch of a wire.

However, in the case of the former, proposed structure since bonding the external lead to the side portion of the semiconductor chip using the adhesive is insufficient, a sealing structure is required to fix the external lead members and semiconductor chip by means of the resin. Furthermore, connection between the external lead members and the pads of the semiconductor chip is still achieved using the bonding wire and welding of a bump electrode. On the other hand, in case of the latter, proposed structure even if the technique is effective for reducing thickness of the sealing resin, connection of the inner lead to the outer lead and bonding the inner lead to the pad part are required. Therefore, the number of assembling steps can not be reduced.

SUMMARY OF THE INVENTION

Therefore, a first object of the present invention is to provide a structure capable of directly bonding an external lead to a pad of a semiconductor chip without using an adhesive to decrease the number of assembling steps.

A second object of the present invention is to provide a packaging structure which does not further require resin sealing.

According to a first aspect of the present invention, there is provided a semiconductor device package comprising:

a semiconductor chip having major surfaces opposite to each other and also having a plurality of pad parts disposed on one of said major surfaces; and a plurality of lead members for electrically connecting the pad parts of the semiconductor chip to a mounting substrate;

each of said lead members having an fitting part with a U-shaped cross section to be fitted into the semiconductor chip from the end part thereof and to pinch the semiconductor chip by means of an elastic restoration force or a plastic deformation thereof, said fitting part being provided with a contact point for conducting to the pad part and a deposit of insulating material for insulating the lead member from the semiconductor chip except the contact point, each the lead member being mounted on the semiconductor chip with the contact point directly being into contact with the pad part of the semiconductor chip and being held in contact therewith.

That is, according to the aforementioned semiconductor device package, the fitting part allows the lead member to pinch and fix the semiconductor chip by means of the elastic restoration force and plastic deformation of the lead member. Besides, the contact point at one end of the lead member is directly brought into contact with the pad part of the semiconductor chip, thereby making it possible to hold the contact state.

DETAILED DESCRIPTION OF THE INVENTION

Figure 1:
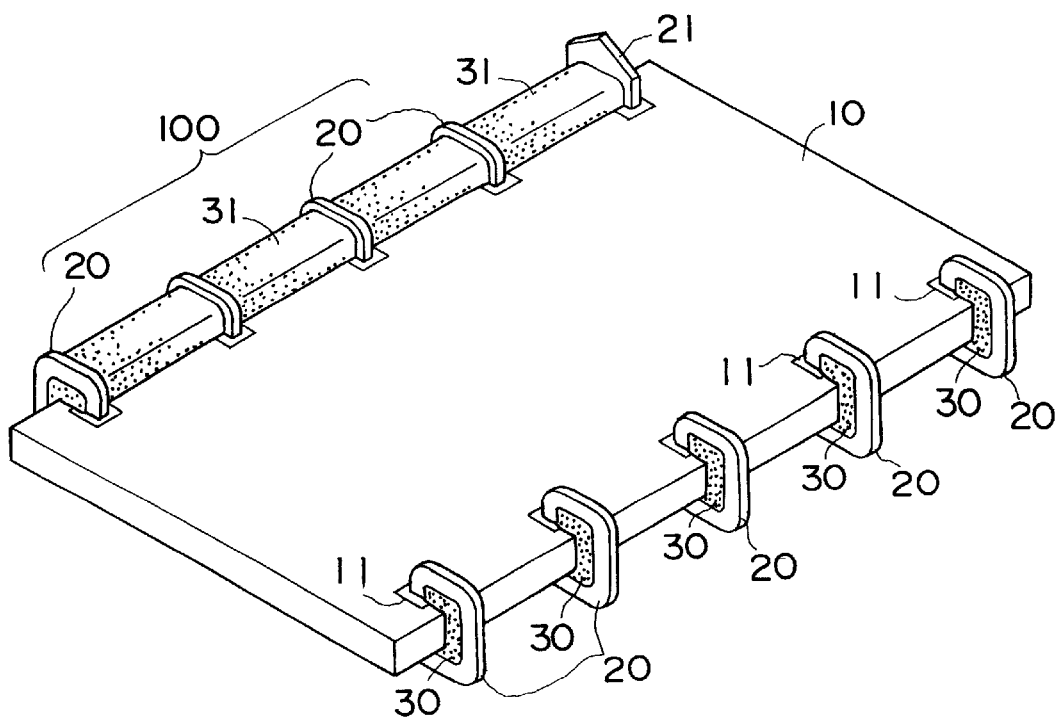
FIG. 1 is a perspective view showing a first packaging structure of the semiconductor device of the present invention.

The present invention can be applied for example, not only to semicoductor devices having a fitting part with a C-shaped metal such as a SOJ (Small Outline J-leaded Package) form and a TSOP (Thin Small Outline P-leaded Package) form, but also to those having a fitting part which includes a lead member and an insulating deposit which surrounds the lead member, such as a TSOL (Thin Small Outline L-leaded Package) form. In case of the former, the lead member has a metal fitting part with an entirely C-shaped cross section and the metal fitting part is provided with an insulating layer in the internal circumference except a contact point for conducting to the pad part, resulting in a U-shaped cross section. Therefore, such a construction is easier to obtain a force for pinching the aforementioned semiconductor chip than the latter construction.

Furthermore, according to the semiconductor device of the present invention, the plurality of lead members are sometimes arranged in a predetermined interval through the aforementioned insulating layer to be integrated with each other, thereby constituting a cover member which is fitted into the aforementioned semiconductor chip from the peripheral end part or which allows the insertion of the semiconductor chip. In this case, since the plurality of lead members cover the semiconductor chip and are pinched and fixed to the semiconductor chip, thereby making it possible to hold the surface protection state, the lead members and semiconductor chip are not always required to be sealed with the resin.

A first constitution of the semiconductor device comprises:

a semiconductor chip having a plurality of pad parts; and a plurality of lead members for electrically connecting the pad part of the semiconductor chip to the mounting substrate, the aforementioned lead members having a metal part whose at least one end serves as a contact point;

wherein the respective lead members are partially embedded in an insulating channel member having a fitting part with a U-shaped cross section, which can be fit into the semiconductor chip from the end thereof, and are arranged and fixed in a predetermined interval in a longitudinal direction to be integrated each other and, at the same time, a construction for insulating the aforementioned lead members from the semiconductor chip except for the aforementioned contact point is provided; and wherein the aforementioned lead members can be plastically deformed, thereby allowing the contact point of one end to directly bring into contact with the pad part of the semiconductor chip under pressure and allowing the shape thereof to be held.

A second constitution of the semiconductor device comprises:

a semiconductor chip having a plurality of pad parts;

and a plurality of lead members for electrically connecting the pad part of the semiconductor chip to the mounting substrate, the aforementioned lead members having a metal part whose at least one end serves as a contact point;

wherein the respective lead members are partially embedded in an insulating rectangular cartridge member having a fitting part with a U-shaped cross section, into which the aforementioned semiconductor chip can be inserted, so as to pinch at least one side edge thereof, and are arranged and fixed in a predetermined interval in a longitudinal direction to be integrated each other and, at the same time, a construction for insulating the aforementioned lead members from the semiconductor chip except for the aforementioned contact point is provided; and wherein the aforementioned lead members can be plastically deformed, thereby allowing the contact point of one end to directly bring into contact with the pad part of the semiconductor chip under pressure and allowing the shape thereof to be held.

In the aforementioned integrated construction, it is preferred to have a mark for representing a one-pin position of the aforementioned lead member.

It is also possible to prevent a decrease in reliability of the tip by further forming a special protective film coat on the surface of the aforementioned semiconductor chip after connecting the aforementioned plurality of lead members to the surface of the aforementioned semiconductor chip.

PREFERRED EMBODIMENTS OF THE INVENTION

FIG. 1 is a perspective view showing the state wherein an integrated lead member 100 of a plurality of lead members as a lead member 11 is packaged on the left side of a DRAM chip 10 and a plurality of lead members 20 are separately packaged on the right side thereof.

Figure 3:
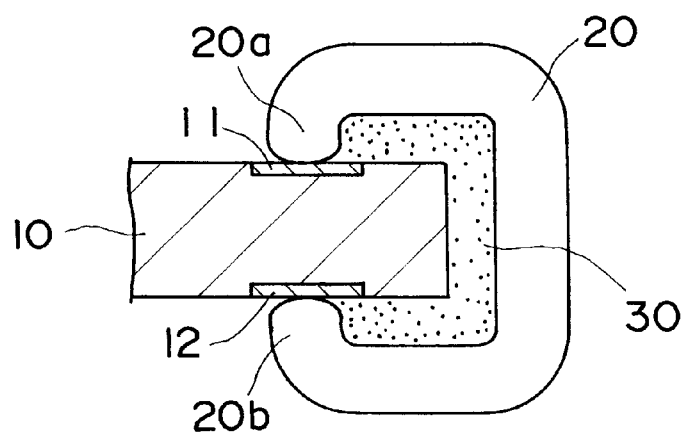
FIG. 3 is a side view showing a lead member according to the first embodiment of the present invention.

The lead members 20 which are separately packaged have a C-shaped cross section, as shown in FIG. 3 as the first embodiment, and respectively have a contact point 20a at one end of the C-shape, and a contact point 20b at the other end located opposite thereto. An insulating resin 30 is molded in the inner surface part of the C-shape to form a fitting part with a U-shaped cross section except for the aforementioned contact point 20a and the contact point 20b located opposite thereto. Accordingly, the lead member 20 is fit into the aforementioned DRAM chip 10 from the end thereof. When the lead member 20 presses the upper and the lower end parts against the pad 11 after fitting to pinch the chip 10, the aforementioned contact point 20e is directly brought into a contact with the pad 11 of the semiconductor chip 10. This contact state can be held because the aforementioned fitting part pinches the aforementioned semiconductor chip 10 by means of an elastic restoration force or a plastic deformation of the part with a U-shaped cross section. On the other hand, since the aforementioned fitting part is provided with an insulating layer 30 in the internal circumference, the aforementioned lead part is electrically insulated from the aforementioned semiconductor. Incidentally, the point 20b of contact between the lead member 20 and the back surface of the tip 10 can be insulated with an insulating layer 12 formed on the chip side.

Figure 4:
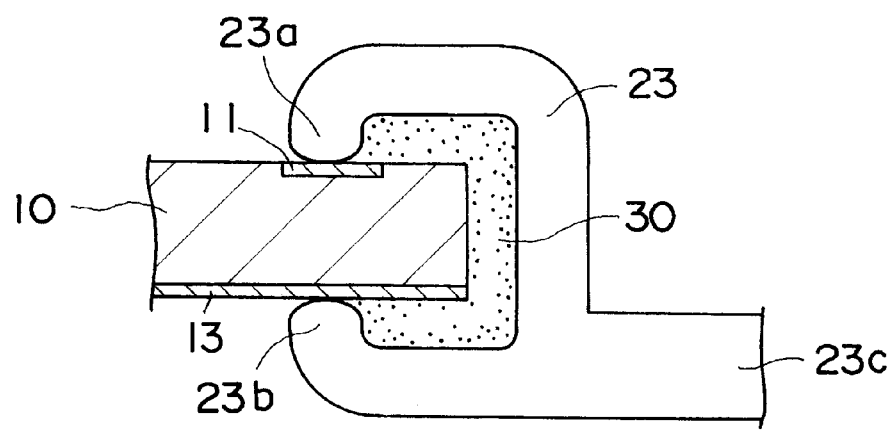
FIG. 4 is a side view showing a lead member according to the second embodiment of the present invention.

The second embodiment of the lead member is shown in FIG. 4. In the second embodiment, a body part 23 with a C-shaped cross section has not only a contact point 23a at one end of the C-shape and a contact point 23b at the other end located opposite thereto so as to impart the same function as that of a conventional TSOP shape in the same manner as FIG. 3, but also an external terminal 23c for bonding with a mounting substrate (not shown), the external terminal projecting to the side from the body part. Furthermore, in FIG. 3, the insulating layer 12 was partially provided on the contact point 20b with the back surface of the semiconductor chip 10. In FIG. 4, an insulating film 13 is formed on the whole surface of the chip 10. Since a masking is not required, the insulating film 13 can be easily formed.

Figure 5:
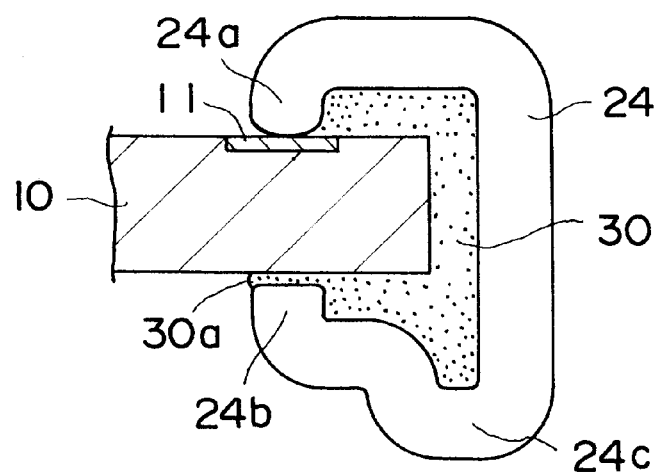
FIG. 5 is a side view showing a lead member according to the third embodiment of the present invention.

The third embodiment of the lead member is shown in FIG. 5. In the third embodiment, a body part 24 with a C-shaped cross section is partially allowed to protrude downward so as to impart the same function as that of a conventional SOJ shape,thereby forming a downward protruding part 24c. Alternatively,in the same manner as FIG. 3, a contact point 24a is provided on one end of the body part 24 while a contact point 24b is provided on the other end located opposite thereto. Accordingly, the bonding with the mounting substrate (not shown) is conducted at the aforementioned projecting part 24c. In FIG. 3, the insulating film 12 was partially provided on the contact point 20b with the back surface of the chip 10. In this embodiment, since the insulating layer 30 is extended to the side of the lower contact point 24b to insulate the lower contact point 24b from the tip 10 with an extension part 30a, it is not required to form an insulating film on the back surface of the chip 10. As a consequence, it is possible to omit a step of forming the insulating layer 12 in the first embodiment and a step of forming the insulating layer 13 in the second embodiment.

Figure 6:
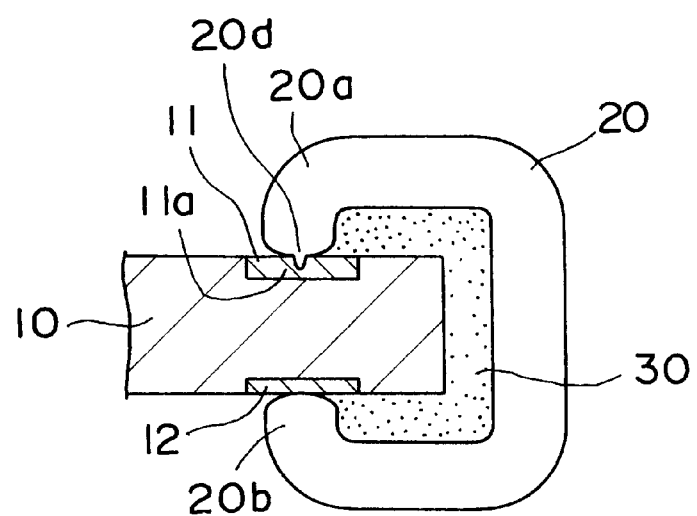
FIG. 6 is a side view showing a lead member according to the fourth embodiment of the present invention.

The fourth embodiment of the lead member is shown in FIG. 6. The body part 20 is the same as that of FIG. 3 and has a C-shaped cross section. The body part 20 has a contact point 20a at one end thereof and a contact point 20b at the other end located opposite thereto. Furthermore, a projection 20d is preferably formed on a tip of the contact point 20a to strengthen fixation by means of a pinching force of the body part 20, while a recess 11a is preferably formed on the pad part 11 of the semiconductor chip 10 to allow the projection 20d of the aforementioned contact point to fit into the recess 11a of the pad part 11. As a consequence, the connection of the lead member 20 to the chip 10 can be strengthened. Incidentally, in case of the aforementioned embodiments including the present embodiment, it is preferred to strengthen a force for pinching/fixing the lead member to the semiconductor chip by using in combination with a conductive adhesive.

In the aforementioned embodiments, the lead member 20 was separately mounted on the semiconductor chip having a plurality of pad parts to electrically connect the pad parts of the semiconductor chip to the mounting substrate. The mounting can be simplified and the protective function of the semiconductor chip 10 can be performed by integrating the aforementioned lead member 20 using the aforementioned insulating material.

Figure 2:
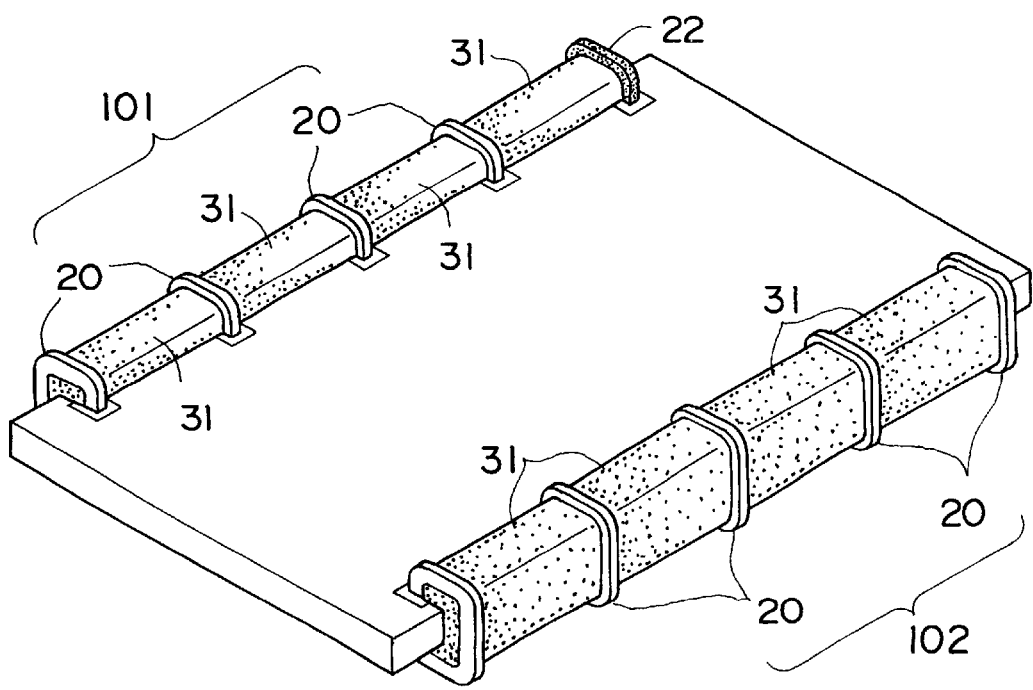
FIG. 2 is a perspective view showing a second packaging structure of the semiconductor device of the present invention.

FIG. 1 shows the integrated lead member 100. The internal circumference of the lead member 20 with a C-shaped cross section which is the same as that of the lead member 20 shown in FIG. 2 is embedded in an insulating channel member 31 having a fitting part with a U-shaped cross section, which can be fit into the aforementioned semiconductor chip 10 from the end thereof, and the lead members 20 are arranged and fixed in a predetermined interval in a longitudinal direction to be integrated with each other. Accordingly, there is provided a construction for insulating the aforementioned lead members 20 from the semiconductor chip 10 except for the aforementioned contact points 20a, 20b using the insulating channel member 31. The aforementioned respective lead members 20 can be plastically deformed, thereby allowing the contact point 20a of one end to directly contact the pad part of the semiconductor chip under pressure and allowing the shape thereof to be held.

The aforementioned integrated lead member 100 can be produced by arranging the lead parts 20 in a predetermined interval in a resin mold and then injection-molding the aforementioned insulating channel member 31. By using this integrated lead member 100, not only a step of connecting respective lead members 20 to the respective pads 11 can be carried out at one time, but also the strength of the lead part can be improved. When using such an integrated lead member, the direction of the tip can be distinguished by providing a mark 21 for representing a one-pin position on the position of the aforementioned integrated lead member 100, and it is preferred in view of a mounting operation.

In the integrated lead member 100 of FIG. 1, the lead member at the one-pin position is formed into a rectangular shape 21. However, in the integrated lead member 101 of FIG. 2, the lead member 22 at the one-pin position is colored. At the position other than one-pin position, an integrated lead member 102 is fit in place of the integrated lead members 100 and 101, representing the one-pin position, the integrated lead member being obtained by embedding the same lead members 20 in an insulating channel member 31 having a fitting part 31 with a U-shaped cross section, which can be fit into the semiconductor chip 10 from the end thereof, followed by arranging and fixing in a predetermined interval in a longitudinal direction (see right side of FIG. 2).

In FIG. 1, the state of bonding of the integrated lead member 100 in combination with the separate lead member 20 was shown. In FIG. 2, the state wherein the integrated lead member 101 representing the one-pin position and the integrated lead member 102 representing no position are fit from the periphery of the semiconductor chip 10 is shown, and the effect of resin molding can be imparted. In the integrated lead members 100, 101 and 102, the lead member 20 with the cross section shown in FIG. 3 is used, but lead members having various shapes can be used in addition to the lead members with cross sections shown in FIG. 4 to FIG. 6, as a matter of course.

Figure 7:
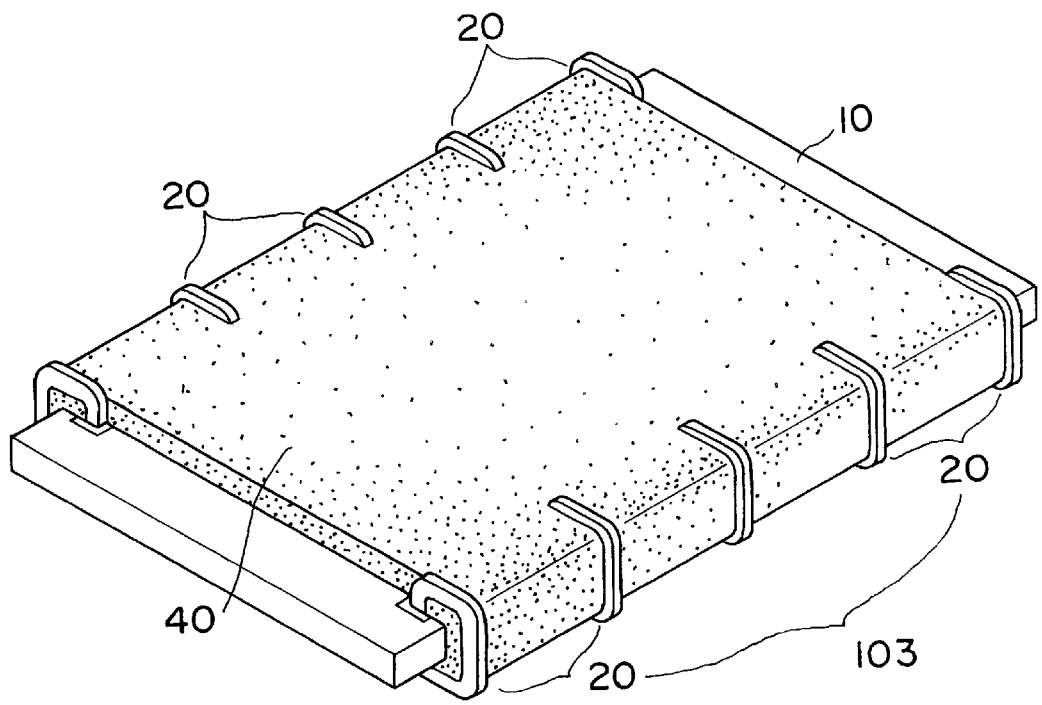
FIG. 7 is a perspective view showing a third packaging structure of the semiconductor device of the present invention.
Figure 8:
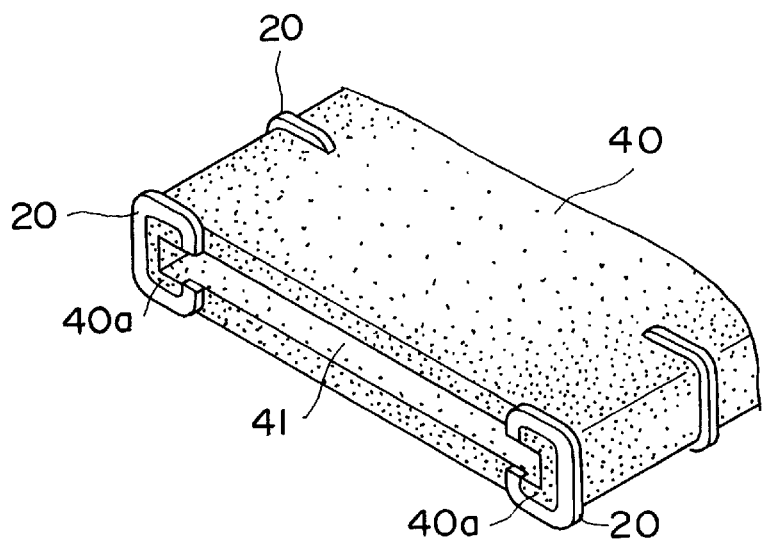
FIG. 8 is a side view showing a box-shaped lead member shown in FIG. 7 according to the fourth embodiment of the present invention.
Figure 9:
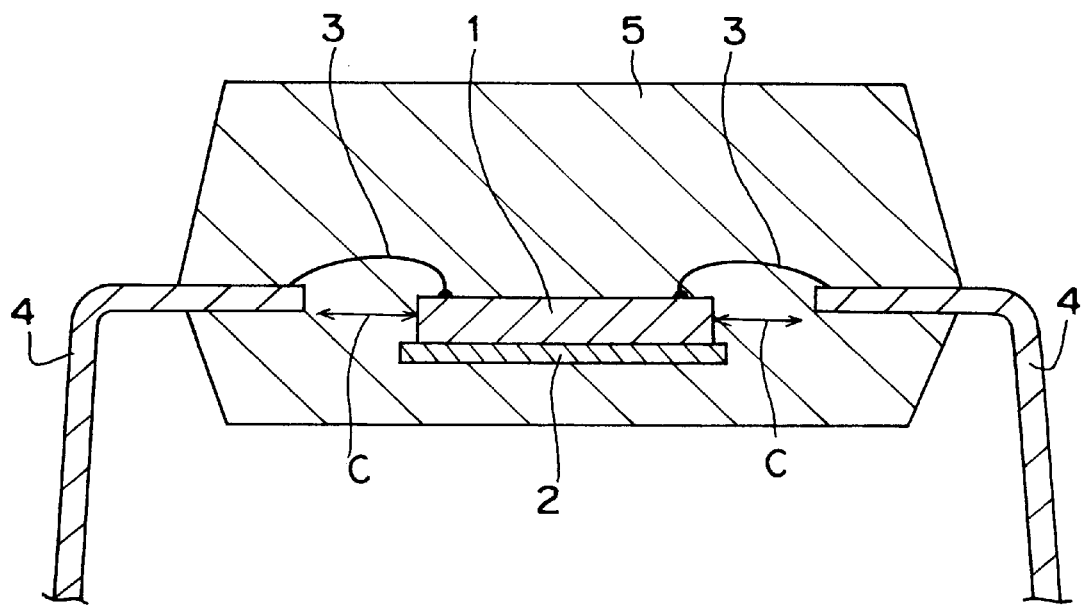
FIG. 9 is a sectional view showing a packaging structure of a conventional semiconductor device.

FIGS. 7 and 8 shows the embodiment wherein an insulating rectangular cartridge member 40 having a fitting part 41 with a U-shaped cross section, into which the aforementioned semiconductor chip 10 can be inserted, is used in place of the aforementioned channel member 31. As the plurality of lead members, the lead members 20 with the cross section shown in FIG. 3 are used. The lead members are partially embedded so as to pinch both side edges of the aforementioned rectangular cartridge member, and are arranged and fixed in a predetermined interval in a longitudinal direction to be integrated each other to form a box-shaped lead member 103. In this case, the respective lead members 20 are provided with an insulating member 40a for insulating from the semiconductor chip 10 except for the aforementioned contact points 20a, 20b in the same manner as shown in FIG. 3. The respective lead members 20 can be plastically deformed, thereby allowing the contact point 20a of one end to directly bring into contact with the pad part 11 of the semiconductor chip 10 under pressure and allowing the shape thereof to be held.

The aforementioned box-shaped lead member 103 can be produced by arranging the lead members 20 in a resin mold in a predetermined interval and then injection-molding the aforementioned insulating rectangular cartridge member 40. By using this box-shaped lead member 103, not only a step of connecting the respective lead members 20 to the respective pads 11 can be carried out at one time, but also the semiconductor chip 10 is surrounded so that the semiconductor chip 10 can be protected in the same manner as the semiconductor chip 10 is resin molded. Incidentally, in the aforementioned box-shaped lead member 103, the lead member 20 with the cross section shown in FIG. 3 is used, but lead members having various shapes can be used in addition to the lead members with cross sections shown in FIG. 4 to FIG. 6, as a matter of course.

After connecting the aforementioned plurality of lead members to the aforementioned semiconductor chip, a glass coat can be further formed on the surface of the semiconductor chip, thereby preventing oxidation and corrosion of the lead part and pad part.

Although the present invention has been described in connection with the preferred embodiments thereof, it should be noted that various changes and modifications are apparent to those skilled in the art. Accordingly, such changes and modifications so far as encompassed by the appended claims are to be understood as included within the scope of the present invention.

What is claimed is:

1. A semiconductor device package comprising:
   a semiconductor chip having a plurality of pad parts disposed on a major surface thereof;
   a plurality of lead members for electrically connecting the pad parts of said semiconductor chip to a mounting substrate; and
   a side cover member of insulating material fitted onto the semiconductor chip from a peripheral edge thereof, wherein each of said lead members has a fitting part with a U-shaped cross section fitted onto said semiconductor chip from a peripheral edge thereof, said fitting part including a contact point for conducting therethrough to said pad part and a deposit of insulating material for insulating portions of said lead member from said semiconductor chip, said side cover member integrating said plurality of lead members at a predetermined interval by the deposit of insulating material along the peripheral edge from one of an outermost two of the lead members to the other of the outermost two of the lead members, each of said plurality of lead members being mounted on said semiconductor chip with said contact point being held in electrical contact with the pad part of said semiconductor chip.

2. A semiconductor device as claimed in claim 1, wherein each said lead member includes:

a sectional substantially C-shaped metal part; and a deposit of insulating material inside said metal part.

3. A semiconductor device package as claimed in claim 1, wherein a lead member positioned at a one-pin position is provided with a mark.

4. A semiconductor device package comprising:

a semiconductor chip having a plurality of pad parts disposed on a major surface thereof;

a plurality of lead members for electrically connecting the pad parts of said semiconductor chip to a mounting substrate; and a whole cover member formed of insulating material and having a penetrating hole to receive said semiconductor chip therein, wherein each of said lead members has a fitting part with a U-shaped cross section to be fitted onto said semiconductor chip from the peripheral edge thereof, said fitting part including a contact point for conducting to said pad part, the plurality of lead members being partially embedded inside said cover member so that the plurality of lead members are integrated with each other at a predetermined interval along peripheral edges of said semiconductor chip, each said lead member being mounted on said semiconductor chip with said contact point held in electrical contact with a corresponding pad part of said semiconductor chip.

5. A semiconductor device as claimed in claim 4, wherein each said lead member includes:

a sectional substantially C-shaped metal part and a deposit of insulating material inside said metal part.

6. A semiconductor device package as claimed in claim 4 wherein a lead member positioned at a one-pin position is provided with a mark.

7. A semiconductor device as claimed in claim 1, wherein said semiconductor chip is provided with a protective coating formed on the major surface after the plurality of lead members are mounted thereon.

8. A semiconductor device according to claim 1, wherein the contact point of a said lead member has a projection which contacts a recess formed in a corresponding pad part of said semiconductor chip.

9. A semiconductor device according to claim 4, wherein the contact point of a said lead member has a projection which contacts a recess formed in a corresponding pad part of said semiconductor chip.

10. A semiconductor device according to claim 2, wherein said metal part includes an external terminal for connection with a mounting substrate.

11. A semiconductor device according to claim 5, wherein said metal part includes an external terminal for connection with a mounting substrate.

12. A semiconductor device according to claim 2, wherein said metal part includes a protruding region which protrudes downward relative to the major surface of said semiconductor chip.

13. A semiconductor device according to claim 5, wherein said metal part includes a protruding region which protrudes downward relative to the major surface of said semiconductor chip.

14. The semiconductor device package as claimed in claim 1, wherein the fitting part each of said lead members applies a pinching force, due to plastic deformation, to said semiconductor chip to provide direct contact with a corresponding pad part of said semiconductor chip.

15. The semiconductor device package as claimed in claim 4, wherein the fitting part of each of said lead members applies a pinching force, due to plastic deformation, to said semiconductor chip to provide direct contact with a corresponding pad part of said semiconductor chip.

* * * * *